United States Patent [19]

Moro et al.

[11] Patent Number: 4,882,224

[45] Date of Patent: Nov. 21, 1989

[54] MAGNETIC PARTICLES, METHOD FOR MAKING AND ELECTROMAGNETIC CLUTCH USING SAME

[75] Inventors: Hideharu Moro; Yoshikazu Narumiya, both of Tokyo, Japan

[73] Assignee: TDK Corporation, Tokyo, Japan

[21] Appl. No.: 187,235

[22] Filed: Apr. 28, 1988

[30] Foreign Application Priority Data

Mar. 30, 1988 [JP] Japan .................................. 63-77395

[51] Int. Cl.⁴ ............................................... B32B 5/16
[52] U.S. Cl. ...................................... 428/403; 427/34; 427/51; 427/57; 427/127; 427/216; 427/255.5; 428/404; 428/694; 428/900
[58] Field of Search ............... 428/403, 404, 405, 694, 428/900; 427/51, 57, 127, 216, 255.5, 34; 118/716; 252/62.56

[56] References Cited

U.S. PATENT DOCUMENTS

| | | | |
|---|---|---|---|
| 3,429,295 | 2/1969 | Shapiro | 118/716 |
| 4,137,361 | 1/1979 | Deffeyes et al. | 428/900 |
| 4,218,507 | 8/1980 | Deffeyes et al. | 428/900 |
| 4,606,941 | 8/1986 | Jenkin | 118/716 |
| 4,632,866 | 12/1986 | Kubota et al. | 428/403 |
| 4,699,082 | 10/1987 | Hakim | 118/716 |

*Primary Examiner*—Paul J. Thibodeau
*Attorney, Agent, or Firm*—Oblon, Spivak, McClelland, Maier & Neustadt

[57] ABSTRACT

Magnetic particles comprising a magnetic core and a shell covering the core are provided wherein the shell is formed from titanium nitride, titanium carbide, aluminum nitride, aluminum oxide, zirconium oxide, silicon nitride, silicon carbide, or a mixture thereof by plasma-assisted chemical vapor deposition while vibrating the core.

9 Claims, 1 Drawing Sheet

MAGNETIC PARTICLES, METHOD FOR MAKING AND ELECTROMAGNETIC CLUTCH USING SAME

BACKGROUND OF THE INVENTION

The invention relates to magnetic particles and a method for making the same. More particularly, it relates to durable magnetic particles suitable for use in electromagnetic connecting devices such as electromagnetic clutches.

An electromagnetic clutch is designed to transmit a torque through a medium in the form of magnetic particles. Frequent use of the clutch or the use of the clutch under a high load would cause magnetic particles to be broken into finer particles or overheat magnetic particles so that the particles are oxidized at their surface to deteriorate their magnetic properties. This is particularly true when the magnetic particles are of pure iron. As a result, the torque transmitted by the clutch is reduced.

One solution is to improve the durability of magnetic particles. It is proposed to form magnetic particles from iron base material having Al, Si, Cr, B or Nb added thereto as disclosed in Japanese Patent Publication No. 56-31451. Another attempt is to plate Cr or Al on the surface of pure iron particles. These attempts are unsuccessful in satisfactorily improving durability.

It is also proposed to use amorphous magnetic powder in order to obtain magnetic particles of high hardness as disclosed in Japanese Patent Application Kokai Nos. 59-159435 and 61-175329. Currently available amorphous magnetic powders are as hard as a Vickers hardness of higher than about 700, but unreliable under the influence of heat. They are not available as spherical particles capable of efficient torque transmission.

SUMMARY OF THE INVENTION

A primary object of the present invention is to provide durable magnetic particles.

Another object of the present invention is to provide magnetic particles which are free of thermal surface oxidation or breakage even when used frequently or under a high load.

A further object of the present invention is to provide a method for making durable magnetic particles.

A still further object of the present invention is to provide an electromagnetic clutch using such magnetic particles.

According to a first aspect of the present invention, there is provided a magnetic particle comprising a magnetic core and a shell covering the core, the shell comprising at least one member selected from the group consisting of titanium nitride, titanium carbide, aluminum nitride, aluminum oxide, zirconium oxide, silicon nitride, and silicon carbide.

According to a second aspect of the present invention, there is provided a method for preparing the above-defined magnetic particles, comprising the step of forming the shell on the core by a plasma-assisted chemical vapor deposition process while vibrating the core.

According to a third aspect of the present invention, there is provided an electromagnetic clutch comprising a cylinder and a rotor rotatably disposed therein, the above-defined magnetic particles being present between the rotor and the cylinder.

BRIEF DESCRIPTION OF THE DRAWING

These and other objects, features, and advantages of the present invention will be better understood from the following description taken in conjunction with the drawing, in which.

DETAILED DESCRIPTION OF THE INVENTION

Figure 1:
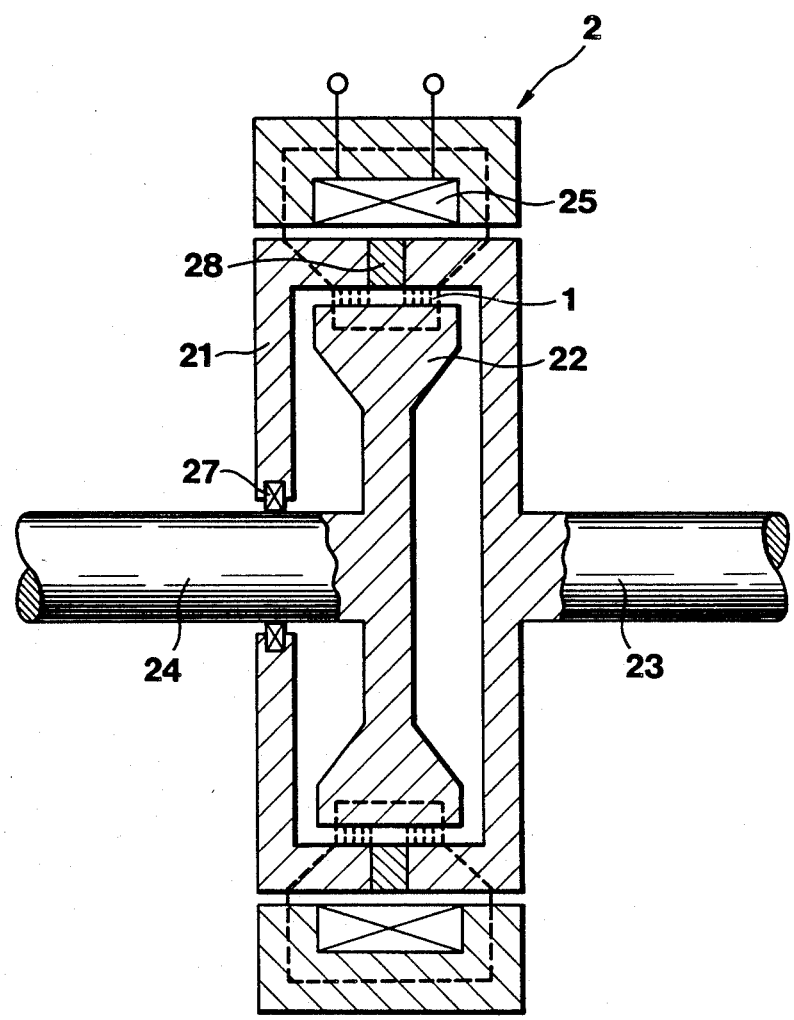
FIG. 1 is the only figure showing in cross section an electromagnetic clutch according to one embodiment of the present invention.

The present invention provides magnetic particles comprising a magnetic core and a shell covering the core. The shell contains at least one member selected from the group consisting of titanium nitride, titanium carbide, aluminum nitride, aluminum oxide, zirconium oxide, silicon nitride, and silicon carbide.

The shell may contain Ti and C and/or N. In this case, the shell is predominantly formed of TiN, TiC or $TiN_xC_{1-x}$ wherein $0<x<1$. These compounds may be present in the shell as a stoichiometric composition with a more or less deviation. The degree of deviation is within the range of N or C or N plus C to Ti of from 0.9:1 to 1.1:1 in atomic ratio.

The shell may contain Al and N. In this case, the shell is predominantly formed of AlN. This compound may be present in the shell as a stoichiometric composition with a more or less deviation. The degree of deviation is within the range of N to Al of from 0.9:1 to 1.1:1.

The shell may contain at least one member selected from aluminum oxide, zirconium oxide, silicon nitride, and silicon carbide. These compounds are present in the shell as their stoichiometric compositions, $Al_2O_3$, $ZrO_2$, $Si_3N_4$, and SiC with a more or less deviation. The degree of deviation is within the range of O to Al of from 1.3:1 to 1.6:1 for $Al_2O_3$, O to Zr of from 1.8:1 to 2.7:1 for $ZrO_2$, N to Si of from 1.3:1 to 1.5:1 for $Si_3N_4$, and C to Si of from 0.9:1 to 1.1:1 for SiC.

These compounds may be contained in the shell alone or in admixture of two or more. When mixtures of two through seven compounds are contained, the compounds may be present in any desired proportion.

The shell may contain H, Cl and other atoms in addition to the specific compound or compounds. When the shell of nitride or carbide contains elemental O as a dopant, the content of oxygen is preferably up to 15 atom %.

The shell preferably has a thickness of from about 2 to 7 $\mu$m, more preferably from about 3 to about 5 $\mu$m. A shell of less than 2 $\mu$m thick will sometimes be insufficient to render magnetic particles fully durable. A shell of more than 7 $\mu$m thick tends to separate from the core because of a rather low bond strength between the shell and the core.

The core may be made of any desired material as long as it is magnetic. Particularly when magnetic particles are used in electromagnetic connecting devices such as electromagnetic clutches, Fe and Fe alloys are desirable because of their cost. Examples of the iron alloys include Fe-Cr, Fe-Cr-Si, Fe-B-Si, Fe-Cr-Si-Al, Fe-B-Si-Cr, Fe-P-C, and Fe-P-C-Cr alloys. The core material is preferably available in the form of gas-atomized powder. Preferably, the core has a generally spherical or elliptical shape. The size of the core is not critical although cores having a particle diameter of about 30 to about 80 $\mu$m are preferred in certain applications.

The preparation of magnetic particles is now described.

The magnetic particles of the present invention are formed by covering a core with a shell as evident from the above-defined structure. According to the feature of the present invention, the shell is formed on the core by a plasma-assisted chemical vapor deposition process while vibrating the core.

More particularly, a plurality of cores are placed as a powder layer of a certain thickness on a pan, usually circular, which is connected to a vibrator. Then vibration is imparted to the cores through the pan. Vibration causes agitation of the core layer so that cores may fluidize within the layer. The cores appearing at the surface of the core layer are continuously replaced by upcoming cores. Plasma-assisted chemical vapor deposition is carried out in this condition. Then the shell-forming material is deposited on the top surface of cores appearing at the surface of the core layer. As the process proceeds, all cores are entirely covered with the shell-forming material to a uniform thickness.

The vibration imparted to the pan may preferably include a circumferential component of movement with respect to the pan in order that all cores on the pan be uniformly covered with the shell. It is preferred to apply vibration at a frequency of about 50 to about 200 Hz and an amplitude of about 0.2 to about 0.5 mm although the frequency and amplitude vary with the size of the pan.

For the same reason as above, the pan is preferably provided with grooves. More preferably, the grooves extend radially of the pan. Most preferably, the grooves extend at a certain angle with respect to a radial direction of the pan. The grooves may be curved.

The plasma-assisted chemical vapor deposition (CVD) used in the practice of the present invention may be an RF or microwave process. For the RF process, an electric power of about 100 watts to about 2 kilowatts may be supplied at a frequency of about 1 to about 30 MHz. For the microwave process, an electric power of about 100 watts to about 1 kilowatt may be supplied at a frequency of about 1 to about 10 GHz.

The source gas used in the plasma-assisted CVD may vary depending on the desired composition of the shell. For example, a shell of TiN may be formed from a mixture of a titanium halide such as $TiCl_4$ and nitrogen ($N_2$) or ammonia ($NH_3$). A shell of TiC may be formed from a mixture of a titanium halide such as $TiCl_4$ and a hydrocarbon gas such as $CH_4$ and $C_2H_6$. A shell of $TiN_xC_{1-x}$ may be formed from a mixture of these gases.

A shell of AlN may be formed from a mixture of an aluminum halide such as $AlCl_3$ or an aluminum alkoxide such as $Al(OC_2H_5)_3$ and $Al(OC_2H_3)_3$ and nitrogen ($N_2$) or ammonia ($NH_3$). A shell of $Al_2O_3$ may be formed from a mixture of an aluminum halide such as $AlCl_3$ or an aluminum alkoxide such as $Al(OC_2H_5)_3$hd 3 and Al-($OCH_3)_3$ and an oxygen-containing gas such as $O_2$, $CO_2$, CO, and $H_2O$.

A shell of $ZrO_2$ may be formed from a mixture of a zirconium halide such as $ZrCl_4$ or a zirconium alkoxide such as $Zr(OCH_3)_5$ and an oxygen-containing gas such as $O_2$, $CO_2$, CO, and $H_2O$.

A shell of $Si_3N_4$ may be formed from a mixture of a silane halide such as $SiCl_4$ or a silane compound such as $Si(CH_3)_4$ and nitrogen ($N_2$) or ammonia ($NH_3$). A shell of SiC may be formed from a mixture of a silane compound such as $Si(CH_3)_4$ and a hydrocarbon gas such as $CH_4$ and $C_2H_6$.

These source gases may be used in admixture.

When it is desired to dope the shell with oxygen, an oxygen-containing gas such as $O_2$, $CO_2$, CO, and $H_2O$ may be added to the source gas.

A carrier gas is usually used along with the source gas. Preferred carrier gases are hydrogen ($H_2$), argon (Ar) and helium (He), with hydrogen gas being most preferred.

Operating parameters may be determined without undue experimentation. For example, the operating pressure is generally in the range of about 0.1 to about 1.5 Torr. The cores are generally heated to a temperature of from about 300° to about 700° C. The power density is in the range of from about 0.1 to about 10 watt/$cm^2$. The rate of forming a shell is in the range of from about 100 to about 500 Å/min.

The magnetic particles prepared by the above-described method have the structure in which a magnetic core is coated over its entire surface with a uniform shell or covering which is resistant against abrasion, impact and oxidation.

It should be understood that the method for preparing magnetic particles according to the present invention is applicable not only to magnetic cores as in the present invention, but also to non-magnetic particles whereby fine particles can be provided with a highly durable hard coating.

Japanese Patent Application Kokai No. 58-171502 discloses a method for preparing ceramic-metal composite fine powder particles each comprising a metal core and a ceramic hell. Magnetic particles as defined in the present invention cannot be formed by this method. The magnetic particles formed by this method have unsatisfactory magnetic properties.

Using the magnetic particles of the present invention, an electromagneteic clutch can be manufactured.

Referring to the figure, there is illustrated an electromagnetic clutch 2 as comprising a stator section and a rotor section. The stator section includes an annular electromagnet having a coil 25 associated therewith. The rotor section includes a driving cylinder 21 and a driven rotor 22 both made of magnetic material. The cylinder 21 which is connected to an input shaft 23 is disposed inside the coil 25 in a concentric arrangement. The disk-shaped rotor 22 which is connected to an output shaft 24 is rotatably disposed within the cylinder 21 with a predetermined spacing therefrom. A seal 27 is formed between the cylinder 21 and the output shaft 24. An annular magnetic shield 28 is disposed in the portion of the cylinder that is opposed to the coil 25. The space between the cylinder 21 and the rotor 22 is filled with magnetic particles 1.

DC current is applied from a DC source to the coil to define a magnetic flux passing the cylinder 21 and the rotor 22 as shown by broken lines. The magnetic particles 1 are linked like a chain along the magnetic flux to form a solid mass which connects the rotor 22 to the cylinder 21 by virtue of a binding force corresponding to the exciting current and magnetic flux associated therewith, transmitting a torque.

When current is interrupted to de-energize the coil, the magnetic particles 1 are released from the connected state and urged toward the inside wall of the cylinder 21 due to the centrifugal force of the cylinder 21. The clutch is released in this way.

It will be understood that the clutch of this construction can be used as a brake if the rotor 22 is secured to a stationary portion.

EXAMPLE

Examples of the present invention are given below by way of illustration and not by way of limitation.

EXAMPLE 1

Magnetic particles were prepared by plasma-assisted chemical vapor deposition under the conditions reported in Table 1. They are designated sample Nos. 11, 12, and 21-28.

The material used as the core of magnetic particles was gas-atomized powder having the composition shown in Table 1 and an average particle size of 50 μm. The shell was deposited to a thickness of 3 μm.

In the plasma-assisted CVD, the pan on which cores were placed was a disk having a diameter of 200 mm which was provided with radial grooves. The pan was vibrated by a vibrator at a frequency of 150 Hz and an amplitude of 0.4 mm.

The thus deposited shell had a uniform thickness of 3 μm with a deviation within ±20%.

As control, the same cores as used in Example 1 were considered magnetic particles, sample Nos. 13 and 29, without forming a shell thereon.

These samples were measured for saturated magnetization $\mu m$ (emu/g) and Vickers hardness Hv (kg/mm$^2$).

The results are shown in Table 1.

EXAMPLE 2

Sample Nos. 11, 12 and 21-28 of Example 1 and control sample Nos. 13 and 29 were tested for durability using an electromagnetic clutch as shown in the figure.

With the samples of Example 1, no reduction of torque transmission efficiency was observed even after 10,000 hour operation. With the control samples, a reduction of torque transmission efficiency of about 40% was observed after 10,000 hour operation.

The effectiveness of the magnetic particles of the present invention is evident from these data. Similar results are obtained with shells having a composite composition of any two or more of TiC, TiN, AlN, Al$_2$O$_3$, ZrO$_2$, SiC, and Si$_3$N$_4$.

The magnetic particles of the present invention are fully resistant to abrasion, impact and oxidation. Even when frequently used in an electromagnetic connecting device under a high load, the magnetic particles are free of deterioration of magnetic properties and highly durable.

Since magnetic particles are prepared by coating cores with a nitride, carbide or oxide material by plasma-assisted chemical vapor deposition while vibrating the cores according to the present invention, all the cores are equally coated over the entire surface with a uniform shell. There are obtained magnetic particles which are highly durable, productive and reliable.

TABLE 1

| Sample No. | Core material | Shell material | Plasma-assisted CVD Source gas* | Carrier gas* | Pressure (Torr) |
|---|---|---|---|---|---|
| 11 | 92Fe—4.5B—3.5Si | TiN | TiCl$_4$(20) NH$_3$(20) | H$_2$(20) | 0.2 |
| 12 | 92Fe—4.5B—3.5Si | Si$_3$N$_4$ | SiCl$_4$(20) NH$_3$(20) | H$_2$(20) | 0.2 |
| 13 control | 92Fe—4.5B—3.5Si | — | — | — | — |
| 21 | 87Fe—12Cr—1Si | TiN | TiCl$_4$(20) NH$_3$(20) | H$_2$(20) | 0.2 |
| 22 | 87Fe—12Cr—1Si | TiC | TiCl$_4$(20) CH$_4$(20) | H$_2$(20) | 0.2 |
| 23 | 87Fe—12Cr—1Si | TiN$_{0.7}$C$_{0.3}$ | TiCl$_4$(20) NH$_3$(10) CH$_4$(10) | H$_2$(20) | 0.2 |
| 24 | 87Fe—12Cr—1Si | AlN | AlCl$_3$(20) NH$_3$(20) | H$_2$(20) | 0.2 |
| 25 | 87Fe—12Cr—1Si | Si$_3$N$_4$ | SiCl$_4$(20) NH$_3$(20) | H$_2$(20) | 0.2 |
| 26 | 87Fe—12Cr—1Si | SiC | SiCl$_4$(20) CH$_4$(20) | H$_2$(20) | 0.2 |
| 27 | 87Fe—12Cr—1Si | Al$_2$O$_3$ | AlCl$_3$(20) H$_2$O(60) | O$_2$ + Ar | 0.4 |
| 28 | 87Fe—12Cr—1Si | ZrO$_2$ | ZrCl$_4$(20) H$_2$O(60) | O$_2$ + Ar | 0.4 |
| 29 control | 87Fe—12Cr—1Si | — | — | — | — |

| Sample No. | Plasma-assisted CVD Core temp. (°C.) | Power density (W/cm$^2$) | Plasma frequency (MHz) | Deposit time (min.) | σm (emu/g) | Hv (kg/mm$^2$) |
|---|---|---|---|---|---|---|
| 11 | 500 | 1.59 | 13.56 | 70 | 200 | 1200 |
| 12 | 600 | 1.59 | 13.56 | 70 | 200 | 1000 |
| 13 | — | — | — | — | 200 | 450 |
| 21 | 500 | 1.59 | 13.56 | 70 | 180 | 1000 |
| 22 | 500 | 4.20 | 13.56 | 90 | 180 | 2000 |
| 23 | 500 | 2.80 | 13.56 | 80 | 180 | 1500 |
| 24 | 500 | 5.50 | 13.56 | 120 | 180 | 1200 |
| 25 | 600 | 1.59 | 13.56 | 70 | 180 | 800 |
| 26 | 700 | 4.20 | 13.56 | 90 | 180 | 1500 |
| 27 | 500 | 5.50 | 13.56 | 120 | 180 | 1600 |
| 28 | 500 | 1.59 | 13.56 | 120 | 180 | 500 |
| 29 | — | — | — | — | 180 | 190 |

*The figure in parentheses is a flow rate in standard cubic centimeter (SCCM).

We claim:

1. A magnetic particle, comprising:
   a magnetic core having a diameter of about 30 to about 80 μm and
   a shell covering the core formed from at least one member selected from the group consisting of titanium nitride, titanium carbide, aluminum nitride, aluminum oxide, zirconium oxide, siicon nitride, and silicon carbide, and having a thickness of about 2 to about 7 μm sufficient to render the particle durable.

2. The particle of claim 1 wherein the magnetic core is formed from iron or an iron alloy.

3. The particle of claim 2, wherein the magnetic core is formed from an iron alloy selected from the group consisting of Fe-Cr, Fe-Cr-Si, Fe-B-Si, Fe-Cr-Si-Al, Fe-B-Si-Cr, Fe-P-C, and Fe-P-C-Cr alloys.

4. The particle of claim 1, wherein the thickness of said shell ranges from about 3 μm to about 5 μm.

5. A method for preparing magnetic particles each having a magnetic core covered with a shell, comprising the steps of:
   preparing magnetic cores each having a diameter of about 30 to about 80 μm, and
   carrying out plasma-assisted chemical vapor deposition while vibrating the cores, thereby forming a shell of at least one member selected from the group consisting of titanium nitride, titanium carbide, aluminum nitride, aluminum oxide, zirconium oxide, silicon nitride, and silicon carbide on each of the cores to a thickness of about 2 to about 7 μm sufficient to render the particles durable.

6. The method of claim 5, wherein the core vibrating step includes placing cores on a platen as a powder layer and vibrating the platen.

7. The method of claim 5, wherein said cores are heated to a temperature within the range of 300° to about 700° C. and the pressure within the device in which plasma-assisted chemical vapor deposition is conducted ranges from about 0.1 to about 1.5 Torr.

8. The method of claim 5, wherein said shells are formed about said cores at a rate ranging from about 100 to about 500 angstroms/minute.

9. A magnetic particle comprising:
   a magnetic core having a diameter of about 30 to about 80 μm, and
   a shell covering said core formed from at least one member selected from the group consisting of titanium nitride, titanium carbide, aluminum nitride, aluminum oxide, zirconium oxide, silicon nitride and silicon carbide, and having a thickness of about 2 to about 7 μm sufficient to render the particle durable such that the Vickers hardness of the shell is at least twice the hardness of the core.

* * * * *